United States Patent [19]

Brown et al.

[11] Patent Number: 4,552,675

[45] Date of Patent: Nov. 12, 1985

[54] COMPOSITION AND METHOD FOR TREATING A SUBTERRANEAN FORMATION

[75] Inventors: Richard A. Brown, Trenton; Robert D. Norris, Cranbury, both of N.J.

[73] Assignee: FMC Corporation, Philadelphia, Pa.

[21] Appl. No.: 524,680

[22] Filed: Aug. 19, 1983

[51] Int. Cl.$^4$ ................................................ C09K 3/00
[52] U.S. Cl. ........................ 252/8.55 R; 166/283; 166/307; 166/308; 166/271; 166/295
[58] Field of Search .................... 252/8.55 R; 166/274, 166/275, 308, 283, 281, 282, 305 R, 294, 295, 271; 536/88, 114

[56] References Cited

U.S. PATENT DOCUMENTS

| | | | |
|---|---|---|---|
| 2,767,167 | 10/1956 | Opie et al. | 260/209 |
| 3,024,191 | 3/1962 | Jones | 252/8.55 |
| 3,058,909 | 10/1962 | Kero | 252/8.55 |
| 3,167,510 | 1/1965 | Alter | 252/8.55 |
| 3,324,017 | 6/1967 | Perry et al. | 204/159.24 |
| 3,442,803 | 5/1969 | Hoover et al. | 252/8.55 |
| 3,634,237 | 1/1972 | Crenshaw et al. | 252/8.55 R |
| 3,649,194 | 3/1972 | Glanville | 23/207.5 |
| 3,727,688 | 4/1973 | Clampitt | 166/283 |
| 3,779,914 | 12/1973 | Nimerick | 252/8.55 R |
| 3,816,151 | 6/1974 | Podlas | 106/194 |
| 3,839,255 | 10/1974 | Podlas | 260/29.6 M |
| 3,888,312 | 6/1975 | Tiner et al. | 166/308 |
| 3,960,736 | 6/1976 | Free et al. | 252/8.55 R |
| 3,974,077 | 8/1976 | Free | 252/8.55 R |
| 4,137,182 | 1/1979 | Golinkin | 252/8.55 R |
| 4,144,179 | 3/1979 | Chatterji | 252/8.55 R |
| 4,169,798 | 10/1979 | DeMartino | 252/8.55 R |
| 4,199,484 | 4/1980 | Murphey | 260/13 |
| 4,202,795 | 5/1980 | Burnham et al. | 252/332 |
| 4,250,044 | 2/1981 | Hinkel | 252/8.55 R |
| 4,259,205 | 3/1981 | Murphey | 252/326 |
| 4,291,069 | 9/1981 | Pilny | 427/140 |
| 4,318,835 | 3/1982 | Clarke | 264/36 |
| 4,368,136 | 1/1983 | Murphey | 252/316 |

OTHER PUBLICATIONS

Schumb, W. C. et al, *Hydrogen Peroxide*, Reinhold, New York (1955), pp. 613 to 614.

*Primary Examiner*—Josephine L. Barr
*Attorney, Agent, or Firm*—Richard E. Elden; Robert L. Andersen

[57] ABSTRACT

An aqueous composition has been developed to treat subterranean formations whereby the compositions can maintain for a period of time a sufficient viscosity to function as a hydraulic fluid and optionally to support particulate matter. Subsequently, the viscosity of the composition decreases to facilitate the removal of the composition.

42 Claims, No Drawings

COMPOSITION AND METHOD FOR TREATING A SUBTERRANEAN FORMATION

This invention relates to a composition and to a method useful for treating a subterranean formation. The composition is particularly adaptable for fracturing a subterranean formation to stimulate the flow of a fluid therefrom or for placing either a permeable or an impermeable pack in contact with a formation.

Hydraulic treatment of a subterranean formation is commonly practiced to stimulate the flow of a fluid therefrom. Frequently the viscosity of a hydraulic liquid is increased, either to prevent the premature loss of the hydraulic liquid or to assist in suspending solid particles in the liquid. Such solid particles may be used as propping agents in a fracture; the solid particles may also be used to form either an impervious consolidated pack in contact with a formation to seal off a porous formation or a permeable pack to retain solid particles within unconsolidated formation.

Subterranean formations suitable for treatment by the method of the present invention may often be those which are accessible by a borehole into the earth. However, the method is equally suitable for use with more accessible formations. Typical of such applications could be to insert an impervious pack adjacent to a basement or a sewer pipe or the like to prevent the flow of a fluid across the pack. On the other hand, it may be desirable to insert a permeable pack adjacent to a basement to permit a fluid to flow to a drain and thus eliminate the build-up of hydrostatic pressures. Applications can be envisioned to control the flow of a fluid at any natural or artificial subterranean interface, such as a buried hot water conduit, a buried heating duct, or a hot spring.

At the completion of the hydraulic treatment, it is desirable to reduce the viscosity of the hydraulic liquid to facilitate its removal from the vicinity of the treated formation; a substantial reduction of viscosity of the hydraulic liquid is generally termed "breaking".

Usually, aqueous compositions, including brines, are selected for such hydraulic fluids because of the ready availability and low cost of water. The aqueous compositions are formulated with thickening agents and other additives well-known in the art to be useful under the conditions within the specific subterranean geological formations.

A wide variety of hydratable polymeric materials have been found useful as thickening agents in such aqueous compositions.

These include hydratable polysaccharides, polyacrylamides, and polyacrylamide copolymers. Particularly desirable polysaccharides include galactomannan gums, derivatives thereof, and cellulose derivatives. Typical polysaccharides include: guar gums, locust bean gum, karagya gum, sodium carboxymethyl guar, hydroxyethyl guar, hydroxypropyl guar, sodium hydroxymethyl cellulose, sodium carboxymethyl-hydroxyethyl cellulose, and hydroxyethyl cellulose.

Optionally, cross-linking agents may be added which increase the maximum temperature at which the hydratable polymers will retain the desired high viscosity. These cross-linking agents are well known in the art and include polyvalent metal ions, such as chromium (III), aluminum (III), titanium (IV) and polyvalent anions, such as borates.

The particular hydratable polymeric material and cross-linking agent selected can limit the pH of the aqueous composition. A pH of 3 or less will frequently cause breaking or loss of viscosity; at a pH of 10 or more the solubility of many of the polymers is insufficient to provide a viscous solution. Preferably, the pH is maintained in the neutral range between 5 and 7.5 to reduce corrosion which would occur at a lower pH and to reduce the costs of buffers or other additives required by a wider pH range. However, by proper choice of material, the effective pH range can be from 1 to 12.

The viscosity of aqueous solutions formulated with such hydratable polymeric materials will reduce or break in time as the result of either biological action or high temperatures. The breaking can be accelerated by the use of chemical additive "breakers", such as enzymes, acids, and oxidizing agents. Peroxygen compounds are desirable oxidizing breaking agents because the peroxygen compounds readily form effective free radicals under the usual conditions of use and no objectionable residue remains to cause disposal problems.

In U.S. Pat. No. 4,144,179 Chatterji discloses that the minimum practical temperature for peroxygen breakers can be decreased from 50° C. to about 20° C. by adding a soluble metal salt wherein the oxidation number of the metal ion is less than the highest possible oxidation number for the metal ion. The metal salts are accelerators which increase the rate of free radical formation by peroxygens and thereby decrease the temperature necessary to generate sufficient free radicals to depolymerize the polymer in a relatively short time. Chatterji suggests as accelerators, the cuprous, ferrous, stannous, cobaltous, chromous, nickelous, titanous, manganous, and arsenous salts of the halides, sulfates, and nitrates.

Chatterji recognizes that it is necessary to delay the time at which the breaking takes place, but the only means he suggests to effect this control is by adding the breaker as a solid, slowly-soluble salt of the metals. As a result, a sufficient concentration of the metal ion will not build up in the composition to cause breaking under ideal conditions until after the treatment of the subterranean formation is completed. This method of control is undesirable because unplanned factors can affect the rate of solution of the solid metal salts, such as the pH and temperature within the formation, as well as the presence of unexpected anions, such as silicates or carbonates. In addition, the metal ions may be physically removed from the solution by natural zeolites, or alternatively, additional ions may be leached from local mineral deposits in the formation.

Burnam et al, in U.S. Pat. No. 4,202,795, also recognize the desirability of delaying the effect of the breakers. Burnam et al teach the use of a coated pellet containing the breaking agent, the coating comprising a solid, hydratable polymeric material similar to the polymers used to increase the viscosity of the aqueous composition. The method of Burnam et al has the disadvantage of merely delaying the release of the breaking agent; it also has the disadvantage of requiring the blending of pellets into the viscous composition. Furthermore, the pellets may be subject to attrition which may cause a premature release of the breaking agent. In addition, after the pellets have been manufactured there are no means to adjust the timing of the release of the active agent in response to unexpected conditions observed in the formation, particularly at the higher temperatures encountered at increased depths.

In the present invention, an aqueous composition has been developed which is suitable for use in treating a subterranean formation. This aqueous composition comprises 1 to 100 kilograms per cubic meter of a hydratable polymeric material, an amount sufficient to increase the viscosity of the aqueous composition; from 1 to 20 parts by weight of a peroxygen compound capable of subsequently generating free radicals per hundred parts by weight of the hydratable polymeric material, thereby reducing the viscosity of the aqueous solution and an organic hydroxyl compound effective as a free radical scavenger. Optionally a transition metal activator may be added. Said activator comprising a metal atom or a soluble coordination compound of a ligand and a metal atom capable of existing in the aqueous composition in a first, or lower, oxidation state, and a second, or higher, oxidation state, and said coordination compound being present in sufficient quantity whereby 0.1 to 10 parts by weight of said metal atom is contained in said aqueous solution per hundred parts of said peroxygen compound.

Optionally, the aqueous composition may contain a reducing agent, and other conventional additives, such as propping agents and cross-linking agents for the hydratable polymeric material.

For the purpose of this invention, the term "inhibitor" shall refer to a free radical scavenger.

The free radical scavenger may be added to the aqueous composition either to delay the time at which the aqueous composition will break, or to permit the aqueous composition to maintain the desired viscosity at higher temperatures. Peroxygen free radical scavengers are well-known and the efficacy of a compound as a peroxygen free radical scavenger is known to vary markedly with the system in which it is used, according to C. Walling, *Free Radicals in Solution.* John Wiley & Sons, New York: (1957) Page 36. Free radical scavengers for peroxygen systems are well known and include hydroxyphenols, amines, and polymerizable monomers which do not tend to form long chains. The latter include unsaturated alcohols and allylic compounds.

It is well known, according to U.S. Pat. No. 3,634,237 and No. 3,888,312, that saturated alcohols which are miscible with water, are useful as part of the hydraulic liquids used to treat a subterranean formation. However, it was unexpectedly found that at a concentration of 1% or greater, said saturated alcohols inhibit the effect of peroxygens in reducing the viscosity. These materials do not appear to function as free radical scavengers as they exhibit no incremental effect.

On the other hand, unsaturated alcohols containing six or less carbon atoms or hydroxyl compounds appear to have an incremental effect as free radical scavengers over a wide range and apparently are not limited in efficacy to any maximum concentrations.

One skilled in the art will normally select a free radical scavenger on the basis of availability and cost effectiveness when used in the subterranean system as part of the aqueous composition. Desirable inhibitors include: unsaturated alcohols containing six or less carbon atoms, aromatic hydroxy compounds, and allylic compounds. Compounds capable of both complexing the metal ion and acting as an inhibitor are preferred. Such compounds include: allyl alcohol, catechol, and 1,10-orthophenanthroline.

The usage of the free radical scavengers will vary according to the efficacy of the compounds and the desired condition of use. Generally, from 0.01 to 5 parts of a free radical scavenger is added per hundred parts of the aqueous solution; preferably 0.05 to 0.5 parts of the scavenger is added per hundred parts of aqueous solution.

One skilled in the art will normally select the ingredients of the aqueous composition on an overall cost-performance basis or an availability basis. Any convenient hydratable polymeric material may be used, such as the hydratable polysaccharides, polysaccharide derivatives, polyacrylamides, and polyacrylamide copolymers conventionally used. Similarly, any convenient peroxygen may be selected as the breaker. Usually it is desirable to use a relatively inexpensive peroxygen compound which will readily generate free radicals at the temperatures found in the formation. Desirable peroxygen compounds include sodium perborate, sodium carbonate peroxide, hydrogen peroxide, potassium diperphosphate and the salts of monopersulfuric acid and dipersulfuric acid. It is generally preferable to use a peroxygen selected from the group consisting of hydrogen peroxide, tertiary butylhydroperoxide, potassium diperphosphate, and the ammonium and alkali metal salts of monopersulfuric acid and ammonium and alkali metal salts of dipersulfuric acid.

The activator may be any coordination compound comprising a soluble metal atom or ligand and a metal atom, said metal atom being capable of existing in the solution in first and second oxidation states in the aqueous composition. The metal atom may be present as a metal ion or as a coordination compound of said metal atom with a single dentate ligand or a chelate formed by a multidentate ligand. It is to be considered that the oxygen in a compound, such as vanadium oxysulfate, functions as a ligand to the metal atom and is within the scope of the invention. The metal atom may be of any transitional metallic element capable of existing in the solution as an ion or forming a coordination compound, and which metal atom will react with the peroxygen to initiate free radical formation. Desirably, the metal atom will be selected from Group IB, Group VIB, Group VIIB and Group VIII of the periodic table. Preferably, the metal atom is a member of the group consisting of silver, iron, copper, and vanadium.

There are several advantages to the use of a coordination compound instead of the metal atom with the same oxidation number. The electrochemical potential can be altered by the choice of the ligand, the maximum concentration of the metallic element can be increased, particularly in the higher pH ranges, and the composition of the aqueous composition is less sensitive to a change in pH or by reaction with minerals likely to be encountered in subterranean formations, such as silicates, carbonates, sulfides, or natural zeolites.

Particularly desirable activators are the 1,10-orthophenanthroline ferrous sulfate complex, commonly called ferroin, and iron and copper complexes of catechol.

Any suitable reducing agent may be used to reduce the metal atom to the lower oxidation state. Desirable reducing agents include sodium sulfite and sodium thiosulfate. However, as the electrochemical potential of the solution is usually increased by a coordination compound, the hydratable polymeric material may function also as a reducing agent.

The following examples are presented to illustrate the best mode of practicing the invention but not be construed to limit the invention to the examples.

EXAMPLES

The experimental procedures used in the examples were variations of the following generalized example. The modifications are as specified in the respective examples.

A viscous solution or gel was formed by dissolving 3.8 g of a hydratable polymeric material, such as hydroxypropyl guar, in 380 ml water. After complete dissolution, a peroxygen breaker, usually 0.2 g ammonium persulfate, was added followed by any other additives as specified, such as activators or free radical scavengers as inhibitors. The pH of the solution was adjusted to pH 6.5 using 10% sulfuric acid or buffered. The solution was allowed to stand at the experimental temperature. The viscosity was determined periodically using a Brookline Selectro-Lectric ™ viscometer (model RVI); a number 3 spindle was used at 20 rpm.

The term "Blank" in the tables indicates the composition contained neither a peroxygen as a breaker nor any additive to activate or inhibit free radical formation. The term "Control" in the tables indicate the presence of the peroxygen breaker but the absence of any additive to activate or inhibit free radical formations.

Comparative Example—(Table I)

A control and sample solution were prepared containing 3.8 g hydroxypropyl guar and 0.2 g ammonium persulfate in 380 ml water at a pH of 6.5. Salts of various metals were added as activators and, after standing at 20°±2° C., the viscosities were recorded in Table I.

Table I shows the effect of a typical peroxygen on the breaking of a hydroxypropyl guar gel, with and without added accelerators.

Example 1—(Table II)

The solutions contained 3.8 g hydroxypropyl guar, 0.2 g ammonium persulfate (except as noted) and 380 ml water. The temperature was 45° C. and the pH was 6.5. The solutions contained no activators; the efficacy of organic compounds added as free radical scavengers is apparent by the decreased rate of decrease of viscosity. Phenols, allylic monomers and unsaturated alcohols are particularly effective as free radical scavengers according to the observed data.

Example 2—(Table III)

The conditions were the same as Example 1 except the temperature was 65° C. and 80° C. Both a Blank (Run 1) and a Control (Run 2) were included. As shown in Table III, allyl alcohol and phenols are shown to be effective at these high temperatures.

Example 3—(Table IV)

The conditions were the same as Example 2 except the solutions were buffered by 1.1 g fumaric acid and 1.1 g sodium bicarbonate to pH 6.5. Both metal activators and inhibitors, organic hydroxyl agents were added. The inhibitors included: allyl alcohol (AA), isopropylphenol (IPP), and catechol (Cat).

As illustrated by Table I, Sample 1, persulfate alone, at 20° C., does not produce a significant reduction in viscosity until after 20 hours. Addition of an activator causes a rapid decrease in viscosity to occur, particularly if used with a complexing agent. The presence of the unsaturated alcohols is seen from this Example to delay the breaking of the gel.

Table IV shows the effect of various combinations of metal activators and inhibitors. For example, the addition of allyl alcohol to a composition containing 1,10-orthophenanthroline ferrous sulfate complex (ferroin) delays the breaking for the 3 hours, even though twice as much of the metal activator is added. The break is completed at 22 hours (Runs 11 and 13). Allyl alcohol shows the same inhibition in the initial period with both copper and silver, even when the metal concentrations are increased 2.5 times with the allyl alcohol (Runs 8 and 9 for Ag and Runs 11 and 14 for Cu). As shown in Table IV, isopropylphenol and catechol are also effective as inhibitors. Such combinations allow the viscosity to remain high during the pumping of viscous fluids without affecting the eventual breaking of the fluids. By proper control of the amounts of metal activator, peroxygen, and inhibitor, a range of time-viscosity profiles can be obtained. This range is advantageous in that pumping times vary and, therefore, the time desired for high viscosity varies. A second advantage of such combination is that the eventual breaking of the gel is not hindered.

Example 4—(Table V)

This example was run at 35° C. and a pH of 8.5. Run 1 was a "Control" without either an activator or inhibitor. In Runs 4 and 5, catechol and allyl alcohol functioned both as a complexing agent and as an inhibitor, demonstrating that the two functions can be supplied by the same compound.

As shown in Table V, iron alone at a high pH is not an effective activator (Run 2). Chelating the iron with 1,10-orthophenanthroline makes it a very effective activator (Run 3). If an inhibitor is added with the chelated iron (Run 4), the initial viscosity remains high while the gel eventually breaks. A complexing inhibitor, such as Catechol (Run 5), only solubilizes the metal to activate the persulfate but also delays the breaking.

The efficacy of activator and inhibitor systems is demonstrated in the following examples using fluids other than water and using other peroxygens.

Example 5—(Table VI)

A 1.5% brine (NaCl) solution replaced the water.

Example 6—(Table VII)

A 5% methanol—95% water solution was used.

Example 7—(Table VIII)

The pH 6.5 buffer of Example 3 was used.

Example 8—(Table IX)

Peroxygens other than ammonium persulfate were used.

Pursuant to the requirements of the patent statutes, the principle of this invention has been explained and exemplified in a manner so that it can be readily practiced by those skilled in the art, such exemplification including what is considered to represent the best embodiment of the invention. However, it should be clearly understood that, with the scope of the appended claims, the invention may be practiced by those skilled in the art and having the benefit of this disclosure, otherwise than as specifically described and exemplified herein.

TABLE I

Activation of Persulfate at 20° C. and pH 6.5
(Comparative Example)

| Run No. | Activator Compound | Valence | g | % Viscosity Reduction 2 hr | 4 hr | 22 hr |
|---|---|---|---|---|---|---|
| 1 | Control | — | 0.0 | 3 | 6 | 28 |
| 2 | $CoSO_4$ | 2 | 0.20 | 0 | 0 | 0 |
| 3 | $V_2O_5$ | 5 | 0.10 | 1 | 5 | 32 |
| 4 | $K_2Cr_2O_7$ | 6 | 0.20 | 0 | 0 | 0 |
| 5 | $NiSO_4$ | 2 | 0.20 | 4 | 7 | 79 |
| 6 | $VOSO_4$ | 4 | 0.02 | 63 | 76 | 85 |
| 7 | $FeCl_3$ | 3 | 0.20 | 49 | 79 | — |
| 8 | $CuSO_4$ | 2 | 0.02 | 40 | 80 | 100 |
| 9 | $Ag_2SO_4$ | 1 | 0.02 | 39 | 60 | 99 |
| 10 | CuCl | 1 | 0.02 | 38 | 57 | 99 |

TABLE II

Inhibition of Persulfate at 45° C. and pH 6.5 (Example 1)

| Run No. | $(NH_4)_2S_2O_8$ g | Inhibitor Compound | g | % Viscosity Reduction 2 hr | 4 hr | 6 hr | 22 hr |
|---|---|---|---|---|---|---|---|
| 1 | — | Blank | 0.00 | 29 | 28 | 29 | 31 |
| 2 | 0.20 | Control | 0.00 | 53 | 80 | 91 | 100 |
| 3 | 0.20 | Methanol | 0.16 | 28 | 73 | 92 | 94 |
| 4 | 0.20 | Methanol | 0.22 | 29 | 64 | 85 | 99 |
| 5 | 0.20 | Ethanol | 1.58 | 29 | 56 | 89 | 99 |
| 6 | 0.20 | 5-butanol | 1.57 | 30 | 60 | 72 | 99 |
| 7 | 0.25 | 1,2-Propanediol | 0.21 | 12 | 69 | 91 | 99 |
| 8 | 0.20 | Sucrose | 2.00 | 30 | 67 | 88 | 99 |
| 9 | 0.20 | 3-Methyl-1-pentyl-3-ol | 1.73 | 31 | 45 | 61 | 99 |
| 10 | 0.20 | Hydroquinone | 2.00 | 3 | 64 | 83 | 98 |
| 11 | 0.20 | Methacrylic Acid | 0.20 | 13 | 60 | 81 | 100 |
| 12 | 0.20 | 1-octene | 1.44 | 26 | 60 | 83 | 100 |
| 13 | 0.20 | Methyl Propargyl Ether | 1.65 | 37 | 53 | 68 | 89 |
| 14 | 0.20 | 2MP* | 0.20 | 22 | 46 | 61 | 98 |
| 15 | 0.20 | Maleic Acid | 0.20 | 57 | 82 | 92 | 99 |
| 16 | 0.20 | 3-Butene-2-ol | 1.66 | 30 | 33 | 36 | 91 |
| 17 | 0.20 | 4-Pentene-1-ol | 1.66 | 31 | 33 | 32 | 80 |
| 18 | 0.20 | 2-Methyl-2-propen-ol | 1.71 | 19 | 28 | 28 | 49 |
| 19 | 0.20 | 2-Cyclohexen-1-ol | 2.00 | 21 | 27 | 29 | 64 |
| 20 | 0.20 | 2-Cyclohexen-1-ol | 0.20 | 22 | 38 | 45 | 89 |
| 21 | 0.20 | 2-Cyclohexen-1-ol | 0.02 | 23 | 59 | 73 | 98 |
| 22 | 0.20 | AA** | 1.71 | 25 | 32 | 38 | 93 |
| 23 | 0.20 | AA | 0.17 | 29 | 51 | 65 | — |
| 24 | 0.20 | AA | 0.02 | 29 | 68 | 85 | — |
| 25 | 0.20 | Phenol | 2.00 | 20 | 28 | 30 | — |

Key
*2MP = 2-Methyl-2-propene-1-sulfonic acid sodium salt
**AA = allyl alcohol

TABLE III

Inhibition of Persulfate at 65° C. to 80° C. and at pH 6.5
(Example 2)

| Run No. | Temperature °C. | Inhibitor Compound | g | % Viscosity Reduction 2 hr | 4 hr | 6 hr |
|---|---|---|---|---|---|---|
| 1 | 65 | — | 0.00 | 47 | 42 | 47 |
| 2 | 65 | — | 0.00 | 97 | 100 | 100 |
| 3 | 65 | AA* | 1.70 | 51 | 83 | 98 |
| 4 | 65 | Phenol | 2.00 | 47 | 51 | 54 |
| 5 | 65 | Phenol | 0.20 | 54 | 77 | 89 |
| 6 | 80 | — | 0.00 | 61 | 69 | 70 |
| 7 | 80 | — | 0.00 | 100 | 100 | 100 |
| 8 | 80 | AA | 0.85 | 100 | 100 | 100 |
| 9 | 80 | Phenol | 1.00 | 81 | 89 | 94 |
| 10 | 80 | IPP** | 0.65 | 80 | 98 | 99 |
| 11 | 80 | IPP | 1.30 | 74 | 95 | 98 |
| 12 | 80 | IPP | 2.00 | 71 | 90 | 94 |

Key
0.20 g $(NH_4)_2S_2O_8$ in all runs except Runs 1 and 5 (Blanks) contained 0.00 g.
*Allyl Alcohol
**Isopropylphenol

TABLE IV

Breaking with Activator and Inhibitor at 20° C. and pH 6.5
(Example 3)

| Run No. | Activator Compound | g | Inhibitor Compound | g | % Viscosity Reduction 1 hr | 2 hr | 3 hr | 4 hr | 5 hr | 6 hr | 22 hr |
|---|---|---|---|---|---|---|---|---|---|---|---|
| 1 | Ferroin | 0.01 | — | 0.00 | 30 | — | 70 | — | 83 | — | 97 |
| 2 | Ferroin | 0.05 | — | 0.00 | 84 | 94 | 100 | — | — | — | — |
| 3 | Ferroin | 0.02 | AA | 0.09 | 10 | — | 60 | — | 82 | — | 96 |
| 4 | Ferroin | 0.02 | IPP | 0.12 | — | 23 | — | 54 | — | 68 | 89 |
| 5 | $VOSO_4$ | 0.02 | — | 0.00 | 63 | — | 70 | — | 74 | — | 86 |
| 6 | $VOSO_4$ | 0.05 | AA | 0.09 | 67 | — | 73 | — | 76 | — | 89 |
| 7 | $VOSO_4$ | 0.10 | IPP | 0.12 | — | 87 | — | 92 | — | 93 | 96 |
| 8 | $Ag_2SO_4$ | 0.02 | — | 0.00 | 16 | — | 63 | — | 79 | — | 100 |
| 9 | $Ag_2SO_4$ | 0.05 | AA | 0.09 | 0 | — | 52 | — | 78 | — | 100 |
| 10 | $Ag_2SO_4$ | 0.10 | IPP | 0.12 | — | 32 | — | 66 | — | 81 | 97 |
| 11 | $CuSO_4$ | 0.02 | — | 0.00 | 17 | — | 65 | — | 84 | — | 98 |
| 12 | $CuSO_4$ | 0.02 | — | 0.00 | — | 41 | — | 79 | — | 89 | 100 |
| 13 | $CuSO_4$ | 0.06 | — | 0.00 | 23 | 80 | — | 96 | — | 100 | — |
| 14 | $CuSO_4$ | 0.10 | — | 0.00 | 50 | 91 | — | 98 | — | 100 | — |
| 15 | $CuSO_4$ | 0.05 | AA | 0.09 | 0 | — | 23 | — | 41 | — | 90 |
| 16 | $CuSO_4$ | 0.02 | AA | 0.10 | — | 4 | 11 | — | 18 | — | 59 |
| 17 | $CuSO_4$ | 0.02 | AA | 0.25 | — | 2 | — | 13 | — | 16 | 34 |
| 18 | $CuSO_4$ | 0.10 | IPP | 0.12 | — | 11 | — | 31 | — | 43 | 78 |
| 19 | $CuSO_4$ | 0.02 | Cat | 0.10 | — | 34 | — | 69 | — | 80 | 98 |

Key
Ferroin = 1,10-orthophenanthroline ferrous sulfate
AA = allyl alcohol
IPP = Isopropyl phenol
Cat = Catechol

TABLE V

Single Compound to Both Complex and Inhibit at 35° C. and pH 8.5 (Example 4)

| Run No. | Activator Compound | g | Inhibitor Compound | g | % Viscosity Reduction 2 hr | 4 hr | 6 hr | 22 hr |
|---|---|---|---|---|---|---|---|---|
| 1 | — | 0.00 | — | 0.00 | 15 | 27 | 40 | 72 |
| 2 | FeCl₃ | 0.02 | — | 0.00 | 0 | 3 | 8 | 45 |
| 3 | Ferroin | 0.01 | — | 0.00 | 78 | 84 | 95 | 99 |
| 4 | FeCl₃ | 0.02 | Cat | 0.20 | 14 | 27 | 36 | 95 |
| 5 | Ferroin | 0.01 | AA | 0.09 | 52 | 79 | 88 | 94 |

Key
Ferroin = 1,10-orthophenanthroline ferrous sulfate
AA = allyl alcohol
Cat = Catechol

TABLE VI

Activation and Inhibition in 1.5% Brine at 20° C. and pH 6.5 (Example 5)

| Run No. | Activator Compound | g | Inhibitor Compound | g | % Viscosity Reduction 2 hr | 4 hr | 6 hr | 22 hr |
|---|---|---|---|---|---|---|---|---|
| 1 | — | 0.00 | — | 0.00 | 2 | 5 | 9 | 17 |
| 2 | VOSO₄ | 0.02 | — | 0.00 | 16 | 26 | 35 | 49 |
| 3 | VOSO₄ | 0.02 | AA | 0.09 | 10 | 15 | 21 | 27 |
| 4 | CuSO₄ | 0.02 | — | 0.00 | 28 | 56 | 80 | 97 |
| 5 | CuSO₄ | 0.02 | AA | 0.09 | 11 | 25 | 43 | 81 |
| 6 | Ferroin | 0.051 | — | 0.00 | 28 | 58 | 78 | 94 |
| 7 | Ferroin | 0.051 | AA | 0.09 | 17 | 41 | 62 | 86 |

Key
Ferroin = 1,10-orthophenanthroline ferrous sulfate
AA = allyl alcohol

TABLE VII

Activation and Inhibition in 5% Methanol at 20° C. and pH 6.5 (Example 6)

| Run No. | Activator Compound | g | Inhibitor Compound | g | % Viscosity Reduction 2 hr | 4 hr | 6 hr | 22 hr |
|---|---|---|---|---|---|---|---|---|
| 1 | — | — | — | 0.00 | 0 | 0 | 0 | 2 |
| 2 | VOSO₄ | 0.05 | — | 0.00 | 5 | 12 | — | 20 |
| 3 | VOSO₄ | 0.10 | — | 0.00 | 29 | 38 | — | 57 |
| 4 | Ferroin | 0.10 | — | 0.00 | 17 | 39 | — | 82 |
| 5 | CuSO₄ | 0.04 | AA | 0.02 | 13 | 33 | — | 90 |
| 6 | CuSO₄ | 0.08 | AA | 0.09 | 13 | 33 | — | 85 |

Key
Ferroin = 1,10-orthophenanthroline ferrous sulfate
AA = allyl alcohol

TABLE VIII

Activation and Inhibition in Buffered Condition at 20° C. and pH 6.5 (Example 7)

| Run No. | Activator Compound | g | Inhibitor Compound | g | % Viscosity Reduction 2 hr | 4 hr | 6 hr | 22 hr |
|---|---|---|---|---|---|---|---|---|
| 1 | — | 0.00 | — | 0.00 | 4 | 8 | — | 21 |
| 2 | VOSO₄ | 0.02 | — | 0.00 | 70 | 74 | — | 86 |
| 3 | VOSO₄ | 0.02 | AA | 0.09 | 63 | 67 | — | 89 |
| 4 | Ag₂SO₄ | 0.02 | — | 0.00 | 54 | 79 | — | — |
| 5 | Ag₂SO₄ | 0.02 | AA | 0.09 | 52 | 78 | — | — |
| 6 | CuSO₄ | 0.02 | — | 0.00 | 65 | 84 | — | — |
| 7 | CuSO₄ | 0.02 | AA | 0.09 | 24 | 41 | — | 90 |
| 8 | Ferroin | 0.05 | — | 0.00 | 70 | 83 | — | — |
| 9 | Ferroin | 0.05 | AA | 0.09 | 60 | 82 | — | 96 |

Key
Ferroin = 1,10-orthophenanthroline ferrous sulfate
AA = allyl alcohol

TABLE IX

Activation and Inhibition of Other Peroxygens at 20° C.–80° C. and at pH 6.5 (Example 8)

| Run No. | Temp °C. | Peroxygen Compound | g | Activator Compound | g | Inhibitor Compound | g | % Viscosity Reduction 2 hr | 4 hr | 6 hr | 22 hr |
|---|---|---|---|---|---|---|---|---|---|---|---|
| 1 | 45 | Caroate | 0.20 | — | 0.00 | — | 0.00 | 35 | 66 | 76 | 98 |
| 2 | 45 | Caroate | 0.20 | — | 0.00 | AA | 3.8 | 27 | 47 | 55 | 89 |
| 3 | 20 | Caroate | 0.20 | — | 0.00 | — | 0.00 | 7 | 12 | 17 | — |
| 4 | 20 | Caroate | 0.20 | VOSO₄ | 0.20 | — | 0.00 | 99 | — | — | — |
| 5 | 45 | KPOP | 0.20 | — | 0.00 | — | 0.00 | 20 | 41 | 48 | — |
| 6 | 45 | KPOP | 0.20 | — | 0.00 | AA | 3.8 | 20 | 34 | 38 | — |
| 7 | 20 | KPOP | 0.20 | — | 0.00 | — | 0.00 | 1 | 2 | 4 | — |
| 8 | 20 | KPOP | 0.20 | VOSO₄ | 0.20 | — | 0.00 | 99 | — | — | — |
| 9 | 20 | KPOP | 0.20 | CuSO₄ | 0.10 | — | 0.00 | 6 | 9 | 13 | 61 |
| 10 | 20 | KPOP | 0.20 | CuSO₄ | 0.10 | AA | 0.09 | 3 | 7 | 12 | 54 |
| 11 | 20 | t-BuOOH | 0.16 | — | 0.00 | — | 0.00 | 1 | 3 | 4 | 6 |
| 12 | 20 | t-BuOOH | 0.16 | CuSO₄ | 0.10 | — | 0.00 | 1 | 2 | 5 | 43 |
| 13 | 20 | t-BuOOH | 0.16 | CuSO₄ | 0.10 | AA | 0.09 | 0 | 1 | 3 | 7 |
| 14 | 80 | t-BuOOH | 0.08 | — | 0.00 | — | 0.00 | 61 | 72 | 75 | — |
| 15 | 80 | t-BuOOH | 0.08 | — | 0.00 | IPPs | 2.9 | 60 | 59 | 63 | — |
| 16 | 80 | — | 0.00 | — | 0.00 | — | 0.00 | 58 | 60 | 63 | — |

Key
Caroate = monopersulfate salt
KPOP = potassium peroxydihosphate
t-BuOOH = tertiary butyl hydroperoxide
AA = allyl alcohol

TABLE X

Persulfate Activation in 26% NaCl Brine at 20° C. and pH 6.5 (Example 9)

| Run No. | (NH₄)₂S₂O₈ g | Activator Compound | g | EDTA g | Thio g | .5 | 1 | 3 | 6 | 22 |
|---|---|---|---|---|---|---|---|---|---|---|
| 1 | 0.2 | CuSO₄ | 0.02 | — | — | 97 | 94 | 88 | 80 | 65 |
| 2 | 0.2 | CuSO₄ | 0.02 | — | — | 80 | 64 | 39 | 25 | 4 |
| 3 | 0.2 | CuSO₄ | 0.02 | — | — | 92 | 87 | 70 | 30 | — |
| 4 | 0.2 | CuSO₄ | 0.02 | — | 0.5 | 69 | 64 | 42 | 41 | — |
| 5 | 0.2 | VOSO₄ | 0.05 | — | — | 75 | 66 | — | — | — |
| 6 | 0.2 | — | — | — | — | — | — | 57 | — | — |

TABLE X-continued

Persulfate Activation in 26% NaCl Brine at 20° C. and pH 6.5
(Example 9)

| Run No. | $(NH_4)_2S_2O_8$ g | Activator Compound | Activator g | EDTA g | Thio g | .5 | 1 | 3 | 6 | 22 |
|---|---|---|---|---|---|---|---|---|---|---|
| 7 | — | $VOSO_4$ | 0.05 | — | — | — | — | — | 13 | 6 |
| 8 | 0.4 | $VOSO_4$ | 0.10 | — | 0.5 | 63 | — | 36 | 25 | 16 |
| 9 | 0.8 | FeAmm | 0.10 | 1.0 | — | 43 | — | 23 | 20 | 17 |
| 10 | 0.4 | FeAmm | 0.05 | 0.5 | — | 51 | 44 | 22 | — | — |
| 11 | 0.4 | $FeCl_3$ | 0.20 | 1.0 | — | 97 | 96 | 95 | — | — |

Key
EDTA = ethylenediamine tetraacetamid sodium salt
Thio = sodium thiosulfate
Ammonium persulfate added after 2.5 hours
$VOSO_4$ added after 5 hours
FeAmm = $FeSO_4.(NH_4)_2.6H_2O$

What is claimed is:

1. An aqueous composition suitable for treating a subterranean formation comprising:
   a. from 1 to 100 kilograms per cubic meter of a hydratable polymeric material selected from the group consisting of polysaccharides, polysaccharide derivatives, polyacrylamides, polyacrylamide copolymers, and mixtures thereof,
   b. from 1 to 20 parts by weight of a peroxygen compound selected from the group consisting of hydrogen peroxide, potassium dipersulfate, ammonium and alkali metal salts of monopersulfuric acid, ammonium and alcohol metal salts of dipersulfuric acid, tertiary butylhydroperoxide and mixtures thereof per hundred parts by weight of said hydratable polymeric material, said peroxygen compound being capable of generating free radicals, thereby reducing the viscosity of said aqueous composition, and
   c. from 0.01 to 5 parts by weight of a free radical scavenger selected from the group consisting of unsaturated alcohols containing six or less carbon atoms, phenols, allylic monomers, and mixtures thereof per hundred parts by weight of the peroxygen compound in the aqueous composition.

2. The aqueous composition of claim 1 wherein the free radical scavenger is allyl alcohol.

3. The aqueous composition of claim 1 wherein the peroxygen compound is hydrogen peroxide.

4. The aqueous composition of claim 2 wherein the peroxygen compound is hydrogen peroxide.

5. The aqueous composition of claim 1 wherein the aqueous composition also contains a cross-linking agent for said hydratable polymeric material.

6. The aqueous composition of claim 2 wherein the aqueous composition also contains a cross-linking agent for said hydratable polymeric material.

7. The aqueous composition of claim 3 wherein the aqueous composition also contains a cross-linking agent for said hydratable polymeric material.

8. The aqueous composition of claim 4 wherein the aqueous composition also contains a cross-linking agent for said hydratable polymeric material.

9. The aqueous composition of claim 5 wherein the aqueous composition also contains a cross-linking agent for acid hydratable polymeric material.

10. The aqueous composition of claim 6 wherein the aqueous composition also contains a cross-linking agent for acid hydratable polymeric material.

11. In a process of treating a subterranean formation by contacting said subterranean formation with an aqueous composition wherein said aqueous composition contains from 1 to 100 kilograms per cubic meter of a hydratable polymeric material selected from the group consisting of polysaccharides, polysaccharide derivatives, polyacrylamides, polyacrylamide copolymers, and mixtures thereof, and from 1 to 20 parts by weight of a peroxygen compound selected from the group consisting of hydrogen peroxide, potassium dipersulfate, ammonium and alkali metal salts of monopersulfuric acid, ammonium and alkali metal salts of dipersulfuric acid, tertiary butylhydroperoxide and mixtures thereof per hundred parts of said hydratable polymeric material, said peroxygen compound being capable of generating free radicals, thereby reducing the viscosity of said aqueous composition, the improvement which comprises said aqueous composition also contains from 0.1 to 10 parts by weight of a free radical scavenger selected from the group consisting of unsaturated alcohols containing six or less carbon atoms, phenols, allylic monomers, and mixtures thereof per hundred parts by weight of the peroxygen compound in the aqueous composition.

12. The process of claim 11 wherein the peroxygen compound is hydrogen peroxide.

13. The process of claim 11 wherein the free radical scavenger is allyl alcohol.

14. The process of claim 12 wherein the free radical scavenger is allyl alcohol.

15. The aqueous composition of claim 1 wherein the free radical scavenger is capable of complexing a metal ion.

16. The aqueous composition of claim 2 wherein the free radical scavenger is capable of complexing a metal ion.

17. The aqueous composition of claim 3 wherein the free radical scavenger is capable of complexing a metal ion.

18. The aqueous composition of claim 4 wherein the free radical scavenger is capable of complexing a metal ion.

19. The aqueous composition of claim 5 wherein the free radical scavenger is capable of complexing a metal ion.

20. The aqueous composition of claim 6 wherein the free radical scavenger is capable of complexing a metal ion.

21. The aqueous composition of claim 7 wherein the free radical scavenger is capable of complexing a metal ion.

22. The aqueous composition of claim 8 wherein the free radical scavenger is capable of complexing a metal ion.

23. The aqueous composition of claim 9 wherein the free radical scavenger is capable of complexing a metal ion.

24. The aqueous composition of claim 10 wherein the free radical scavenger is capable of complexing a metal ion.

25. The process of claim 11 wherein the free radical scavenger is capable of complexing a metal ion.

26. The process of claim 12 wherein the free radical scavenger is capable of complexing a metal ion.

27. The process of claim 13 wherein the free radical scavenger is capable of complexing a metal ion.

28. The process of claim 14 wherein the free radical scavenger is capable of complexing a metal ion.

29. The aqueous composition of claim 1 wherein the free radical scavenger is selected from the group consisting of allyl alcohol, catechol, and 1,10-orthophenanthroline.

30. The aqueous composition of claim 2 wherein the free radical scavenger is selected from the group consisting of allyl alcohol, catechol, and 1,10-orthophenanthroline.

31. The aqueous composition of claim 3 wherein the free radical scavenger is selected from the group consisting of allyl alcohol, catechol, and 1,10-orthophenanthroline.

32. The aqueous composition of claim 4 wherein the free radical scavenger is selected from the group consisting of allyl alcohol, catechol, and 1,10-orthophenanthroline.

33. The aqueous composition of claim 5 wherein the free radical scavenger is selected from the group consisting of allyl alcohol, catechol, and 1,10-orthophenanthroline.

34. The aqueous composition of claim 6 wherein the free radical scavenger is selected from the group consisting of allyl alcohol, catechol, and 1,10-orthophenanthroline.

35. The aqueous composition of claim 7 wherein the free radical scavenger is selected from the group consisting of allyl alcohol, catechol, and 1,10-orthophenanthroline.

36. The aqueous composition of claim 8 wherein the free radical scavenger is selected from the group consisting of allyl alcohol, catechol, and 1,10-orthophenanthroline.

37. The aqueous composition of claim 9 wherein the free radical scavenger is selected from the group consisting of allyl alcohol, catechol, and 1,10-orthophenanthroline.

38. The aqueous composition of claim 10 wherein the free radical scavenger is selected from the group consisting of allyl alcohol, catechol, and 1,10-orthophenanthroline.

39. The process of claim 11 wherein the free radical scavenger is selected from the group consisting of allyl alcohol, catechol, and 1,10-orthophenanthroline.

40. The process of claim 12 wherein the free radical scavenger is selected from the group consisting of allyl alcohol, catechol, and 1,10-orthophenanthroline.

41. The process of claim 13 wherein the free radical scavenger is selected from the group consisting of allyl alcohol, catechol, and 1,10-orthophenanthroline.

42. The process of claim 14 wherein the free radical scavenger is selected from the group consisting of allyl alcohol, catechol, and 1,10-orthophenanthroline.

* * * * *

UNITED STATES PATENT AND TRADEMARK OFFICE
CERTIFICATE OF CORRECTION

PATENT NO. : 4,552,675
DATED : November 12, 1985
INVENTOR(S) : Richard A. Brown and Robert D. Norris It is certified that error appears in the above—identified patent and that said Letters Patent is hereby corrected as shown below:

Claim 1, lines 23 to 24, delete "the peroxygen compound in". Delete claims 9 and 10. Claim 11, line 19, replace "0.1 to 10 parts" with --0.01 to 5 parts--. Claim 11, line 23, delete "the peroxygen compound in". Delete claims 23 and 24.

Signed and Sealed this

Eighteenth Day of February 1986

[SEAL]

Attest:

DONALD J. QUIGG

Attesting Officer    Commissioner of Patents and Trademarks